United States Patent
Bright et al.

(10) Patent No.: US 6,312,525 B1
(45) Date of Patent: *Nov. 6, 2001

(54) MODULAR ARCHITECTURE FOR SEMICONDUCTOR WAFER FABRICATION EQUIPMENT

(75) Inventors: Nick Bright, San Jose, CA (US); Ben Mooring, Austin, TX (US)

(73) Assignee: Applied Materials, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/111,472

(22) Filed: Jul. 8, 1998

Related U.S. Application Data

(63) Continuation of application No. 08/893,730, filed on Mar. 20, 1998, now abandoned.
(60) Provisional application No. 60/088,353, filed on Jul. 11, 1997.

(51) Int. Cl.$^7$ .................................................. C23C 16/00
(52) U.S. Cl. ............... 118/719; 204/298.25; 204/298.35; 414/937
(58) Field of Search ....................... 118/719; 204/298.25, 204/298.35; 414/937

(56) References Cited

U.S. PATENT DOCUMENTS

| | | | |
|---|---|---|---|
| 4,405,435 | 9/1983 | Tateishi et al. ...................... | 204/298 |
| 4,498,416 | 2/1985 | Bouchaib ............................ | 118/719 |
| 4,592,306 | 6/1986 | Gallego ............................... | 118/719 |

(List continued on next page.)

FOREIGN PATENT DOCUMENTS

| | | | |
|---|---|---|---|
| 0756316A1 | 1/1997 | (EP) | ............................ H01L/21/00 |
| 756 316 A1 | 1/1997 | (EP) . | |
| 60-221572 | 6/1985 | (JP) | .............................. C23C/14/56 |
| 61-170568 | 8/1986 | (JP) | .............................. C23C/14/56 |
| 61-246381 | 11/1986 | (JP) | ................................ C23F/4/00 |
| 62-116769 | 5/1987 | (JP) | .............................. C23C/16/44 |
| 62-131455 | 6/1987 | (JP) | ............................. H01J/37/317 |
| 62-164875 | 7/1987 | (JP) | .............................. C23C/14/56 |
| 4-87782 (A) | 3/1992 | (JP) | ............................. B25B/23/157 |
| 4-87784 (A) | 3/1992 | (JP) | ................................. B25J/5/00 |
| 4-87785 (A) | 3/1992 | (JP) | ................................. B25J/9/06 |
| WO 87/07309 | 12/1987 | (WO) | ............................. C23C/16/00 |

OTHER PUBLICATIONS

U.S. Patent application Ser. No. 09/451,628 filed Nov. 30, 1999.

*Primary Examiner*—Jeffrie R. Lund
(74) *Attorney, Agent, or Firm*—Moser, Patterson & Sheridan, LLP

(57) ABSTRACT

A modular vacuum system may have vacuum chamber modules, power supply modules and control system modules. The vacuum chamber modules may be defined with a clear interface between them. There may be several interfaces on a transfer chamber module that provide connections to any process chamber module. The interfaces may provide common facilities and electrical connections to matching connections on the process chambers and may also provide some configurability with a removable optional facilities interface. The power supply modules may provide all of the power necessary for one corresponding chamber module and be built into cabinets for connecting together as a modular and scalable system. The modular control system may have objects that represent each chamber module in the vacuum system; and may have a system level that configures, initiates, distributes and controls the objects. Each of the objects may be made of a hierarchical set of software modules that represent the different functions and devices of the chamber modules.

18 Claims, 13 Drawing Sheets

U.S. PATENT DOCUMENTS

| | | | |
|---|---|---|---|
| 4,607,593 | 8/1986 | Van Hemel | 118/719 |
| 4,664,062 | 5/1987 | Kamohara et al. | 118/719 |
| 4,681,773 | 7/1987 | Bean | 427/38 |
| 4,709,655 | 12/1987 | Van Mastrigt | 118/719 |
| 4,715,921 | 12/1987 | Maher et al. | 156/345 |
| 4,717,461 | 1/1988 | Strahl et al. | 204/192.1 |
| 4,722,298 * | 2/1988 | Rubin et al. | 118/715 |
| 4,733,631 | 3/1988 | Boyarsky et al. | 118/719 |
| 4,739,787 | 4/1988 | Stoltenberg | 137/14 |
| 4,820,106 | 4/1989 | Walde et al. | 414/217 |
| 4,825,808 | 5/1989 | Takahashi et al. | 118/719 |
| 4,852,516 | 8/1989 | Rubin et al. | 118/715 |
| 4,857,160 * | 8/1989 | Landau et al. | 204/192.12 |
| 4,886,592 | 12/1989 | Anderle et al. | 204/298 |
| 4,917,556 | 4/1990 | Stark et al. | 414/217 |
| 4,951,601 | 8/1990 | Maydan et al. | 118/719 |
| 5,000,113 | 3/1991 | Wang et al. | 118/723 |
| 5,067,218 | 11/1991 | Williams | 29/25.01 |
| 5,076,205 * | 12/1991 | Vowles et al. | 118/719 |
| 5,083,364 | 1/1992 | Olbrich et al. | 29/564 |
| 5,088,444 | 2/1992 | Ohmine et al. | 118/719 |
| 5,186,718 | 2/1993 | Tepman et al. | 29/25.01 |
| 5,199,483 | 4/1993 | Bahng | 165/1 |
| 5,259,881 | 11/1993 | Edwards et al. | 118/719 |
| 5,292,393 * | 3/1994 | Maydan et al. | 156/345 |
| 5,352,248 | 10/1994 | Ishikawa et al. | 29/25.01 |
| 5,380,682 | 1/1995 | Edwards et al. | 437/225 |
| 5,516,732 | 5/1996 | Flegal | 437/250 |
| 5,520,002 | 5/1996 | Ishikawa | 62/55.5 |
| 5,582,866 | 12/1996 | White | 427/248.1 |
| 5,611,655 | 3/1997 | Fukasawa et al. | 414/217 |
| 5,620,578 | 4/1997 | Hurwitt | 204/298.25 |
| 5,740,034 * | 4/1998 | Saeki | 364/167.01 |
| 5,758,680 * | 6/1998 | Kaveh et al. | 137/14 |
| 5,769,952 | 6/1998 | Komino | 118/733 |
| 5,784,238 | 7/1998 | Nering et al. | 361/65 |
| 5,785,796 * | 7/1998 | Lee | 156/345 |
| 5,855,681 | 1/1999 | Maydan et al. | 118/719 |
| 5,873,942 | 2/1999 | Park et al. | 118/719 |
| 5,900,105 | 5/1999 | Toshima | 156/345 |
| 5,930,456 | 7/1999 | Vosen | 392/416 |
| 5,944,857 | 8/1999 | Edwards et al. | 29/25.01 |
| 6,017,395 | 1/2000 | Matuno et al. | 118/715 |
| 6,083,321 | 7/2000 | Lei et al. | 118/719 |
| 6,120,606 | 9/2000 | Peng | 118/719 |

* cited by examiner

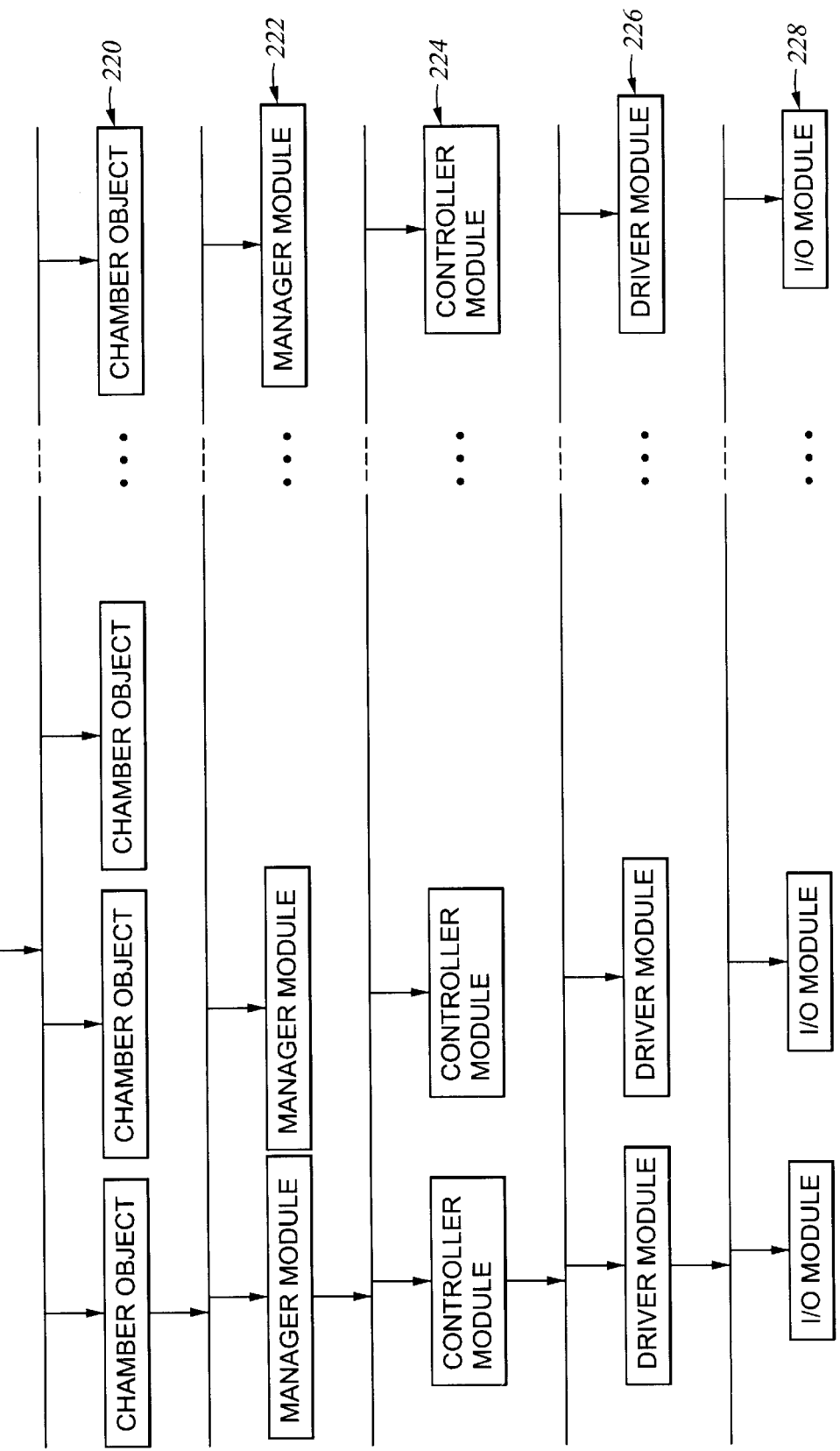

MODULAR ARCHITECTURE FOR SEMICONDUCTOR WAFER FABRICATION EQUIPMENT

This application is a continuation of U. S. patent application Ser. No. 08/893,730 filed Mar. 20, 1998, now abandoned, and claim benefit of Provisional No. 60/088,353, filed Jul. 11, 1997.

FIELD OF THE INVENTION

This invention relates generally to systems for manufacturing integrated circuits on wafers. More specifically, the invention relates to a modular architecture for equipment which manufactures integrated circuits on wafers.

BACKGROUND OF THE INVENTION

Typically, equipment used to produce integrated circuits on silicon wafers is referred to as wafer fabrication equipment (WFE). WFE may be generally classified as batch tools, which process a number of wafers simultaneously, or single wafer tools which process wafers individually. In the past, most of the commercially available WFE was designed as batch tools. More recently, the size of silicon wafers, the size of critical features on the wafers, and the complexity of the devices being built has led the industry to produce a much higher percentage of single wafer tools. Of these single wafer tools, a significant number may be classified as cluster tools. A cluster tool consists of a central chamber which houses a robot which serves to manipulate wafers in the tool. The central chamber is typically referred to as a transfer chamber. Around the transfer chamber are located additional chambers which are intended to perform some process on the wafers that are being moved through the system. Also attached to the transfer chamber are one or two load lock chambers. The load lock chambers serve to introduce wafers from the outside environment into the cluster tool.

A cluster tool is typically operated as follows. The transfer chamber is brought to a vacuum by an integrated pumping system. Each of the process chambers are isolated from the transfer chamber by an isolation valve which allows the process chambers to operate at a different level of vacuum than the transfer chamber and prevents any gasses being used in the process chamber from being introduced into the transfer chamber. The load lock chambers are also isolated from the transfer chamber with isolation valves. Each load lock chamber has a door which opens to the outside environment. In normal operation, a cassette loaded with wafers is placed into a load lock chamber through the door and the door is closed. The load lock chamber is then evacuated to the same pressure as the transfer chamber and the isolation valve between the load lock chamber and transfer chamber is opened. The robot in the transfer chamber is moved into position and one wafer is removed from the load lock chamber. The load lock chamber is preferably equipped with an elevator mechanism so as one wafer is removed from the cassette, the elevator moves the stack of wafers in the cassette to position another wafer in the transfer plane so that it can be positioned on the robot blade. The robot in the transfer chamber then rotates with the wafer so that the wafer is aligned with a process chamber position. The process chamber is flushed of any toxic gasses, brought to the same pressure level as the transfer chamber, and the isolation valve is opened. The robot then moves the wafer into the process chamber where it is lifted off the robot. The robot is then retracted from the process chamber and the isolation valve is closed. The process chamber then goes through a series of operations to execute a specified process on the wafer. When complete, the process chamber is brought back to the same environment as the transfer chamber and the isolation valve is opened. The robot removes the wafer from the process chamber and then either moves it to another process chamber for another operation or replaces it in a load lock chamber to be removed from the system when the entire cassette of wafers has been processed.

To improve the productivity of the cluster tools, some wafer manufacturers have automated the loading and unloading of the load lock chambers by including systems that can take a cassette of wafers from a passing vehicle and load it into an open load lock chamber. Similarly, these systems can remove a processed cassette of wafers and place them on a vehicle to be taken to other tools for further processing.

Typically, a cluster tool typically must perform a significant number of functions. The cluster tool must be capable of manipulating wafers through the tool without damaging the wafer or causing particles to be created which may interfere with the function of the process chamber or contaminate the wafer. This wafer handling process includes mechanisms and associated sensors to verify that the wafers have been properly handled. The cluster tool must also be capable of managing the environment of the transfer chamber, the load lock chambers, and each of the process chambers. This involves significant variations in pressure as well as the introduction of a number of different gasses and the creation of plasmas. The tool must also manage the power that is supplied to each of the chambers and provide a control interface to the outside environment which may be a human operator, another control computer, or both.

Currently, cluster tools are designed and built with the following approach. A function or set of functions for the tool is chosen. This dictates the number and type of process chambers that will be attached to the transfer chamber. All of the various systems for wafer handling, pressure control, gas management, power management, and system control hardware are then designed for the specific configuration that is being developed. The computer software that controls the various systems is written so that the tool performs the desired set of processes. Typically, this tool is marketed as a tool to perform the specific functions for which it was designed. The tool is assembled, tested, and delivered to the end users as an integrated unit. The time it takes to complete this design process can be quite lengthy. Modification of any of the intended process functions is difficult because the original tool was designed as an integrated system and any significant changes will necessitate an entirely new design.

Additionally, the manufacture of the tool is somewhat complicated because of the integrated nature of the design. Since the tool controller is designed on the assumption that the tool is one integrated system, it is difficult to test individual portions of the tool. Significant testing must be held until most of the tool is assembled. Because of the complexity of the complete tool, this system test can be a time consuming process. Errors made early in the manufacturing process may not be found until late in testing and may result in a significant amount of effort to correct.

As discussed above, it is customary for cluster tools to be shipped to the end user as a complete unit. The recent move to larger wafer sizes will significantly effect this practice. Equipment designed to accommodate 300mm wafers is too large to be transported economically after assembly. This will necessitate assembly at the fabrication facility for testing, disassembly for shipping, and re-assembly at the end user's site. This additional assembly operation will make tool integration at the end user's site a significantly more involved operation with a much higher costs.

Therefore, there is a need for a modular tool which includes a flexible design and can be assembled, disassembled, reconfigured and reassembled quickly and easily.

SUMMARY OF THE INVENTION

The above-described deficiencies may be remedied by defining and implementing a modular architecture for cluster tools. In such an architecture, each portion or module of the tool has a clearly defined set of functions that it is to perform and a specifically defined interface between itself and other modules with which it may interact. In one embodiment, a cluster tool includes a central cluster module, one or more load lock modules, a set of process chamber modules and, preferably, a factory interface module. Each of these modules includes a set of functions that it is intended to perform. The central cluster module would be responsible for providing an environment that is compatible with the process chamber modules, providing an appropriate isolation valve between each process chamber module and the central cluster, delivering wafers to each process chamber module, removing wafers from the process chamber modules, providing any gasses, liquids, or other services that may be required by the process chamber modules, and interacting with the load lock modules to provide a continuous flow of wafers to the process chamber modules. The load lock modules are responsible for accepting wafers from a human operator, some type of automated wafer handling system, or the factory interface module and changing the environment in which the wafers reside so that it is compatible with the central cluster module. The module is also responsible for manipulating, i.e. indexing, the wafers so that the robot in the central cluster module may remove and replace wafers from the load lock module. The factory interface module, if used, would be responsible for receiving cassettes or enclosed pods of wafers from either a human operator or an automated wafer handling system, opening the pod, and moving the wafers to and from the load lock modules. The process chamber modules are responsible for receiving wafers from the central cluster module, processing the wafers, and allowing the wafers to be removed by the central cluster module.

Each module has its own control system so that the commands that are passed between it and the other modules are at a high level. For example, a load lock module would receive a command such as "Index to Next Wafer" and return a command such as "Wafer Ready". All of the detailed control actions that are required to make this action happen are handled by the module control system. In this way, the control interaction between any module and the other modules is limited to commands that define the operation of a specific module and not to specifics about how the operations are implemented.

Each module has a clearly defined and controlled interface. This interface includes a physical geometry, a set of utilities, and a precise definition of the control communications that pass between it and the other modules or the environment outside the tool. The physical interface includes the mounting locations and necessary hardware, the envelope that will be used for wafer exchange, and the space that is allowed for each module. The interface definition also specifies the location, size, and fittings for facilities such as power, gasses, fluids, and communication lines for the control system.

The advantages of this modular architecture are significant. Early in the design of a cluster tool, system engineers define the modules that will exist, the function of each module, and the necessary interfaces between the modules and the outside environment. After these definitions are complete, the engineers designing each module are free to implement the design as they see fit without concern as to how the other modules are being designed. As long as the interface definition is not violated, the resulting modules can be easily integrated into a single system. If it becomes necessary to modify an interface, this modification is again accomplished at a system level. The system engineers inform all of the appropriate module developers of the change and module modifications are made where appropriate. This architecture allows development of many modules simultaneously. When the basic tool design has been completed, the modular architecture allows for a module to be modified or enhanced with no impact to the rest of the system as long as the interfaces are unchanged. Since the modules are designed with internal controls, they can be manufactured and tested independently. This will facilitate final system integration since the system will be built out of a relatively small number of modules that have already been completely tested and problems corrected.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

FIG. 15 is a schematic of the logical architecture for a modular control system.

DETAILED DESCRIPTION OF A PREFERRED EMBODIMENT

Figure 1:
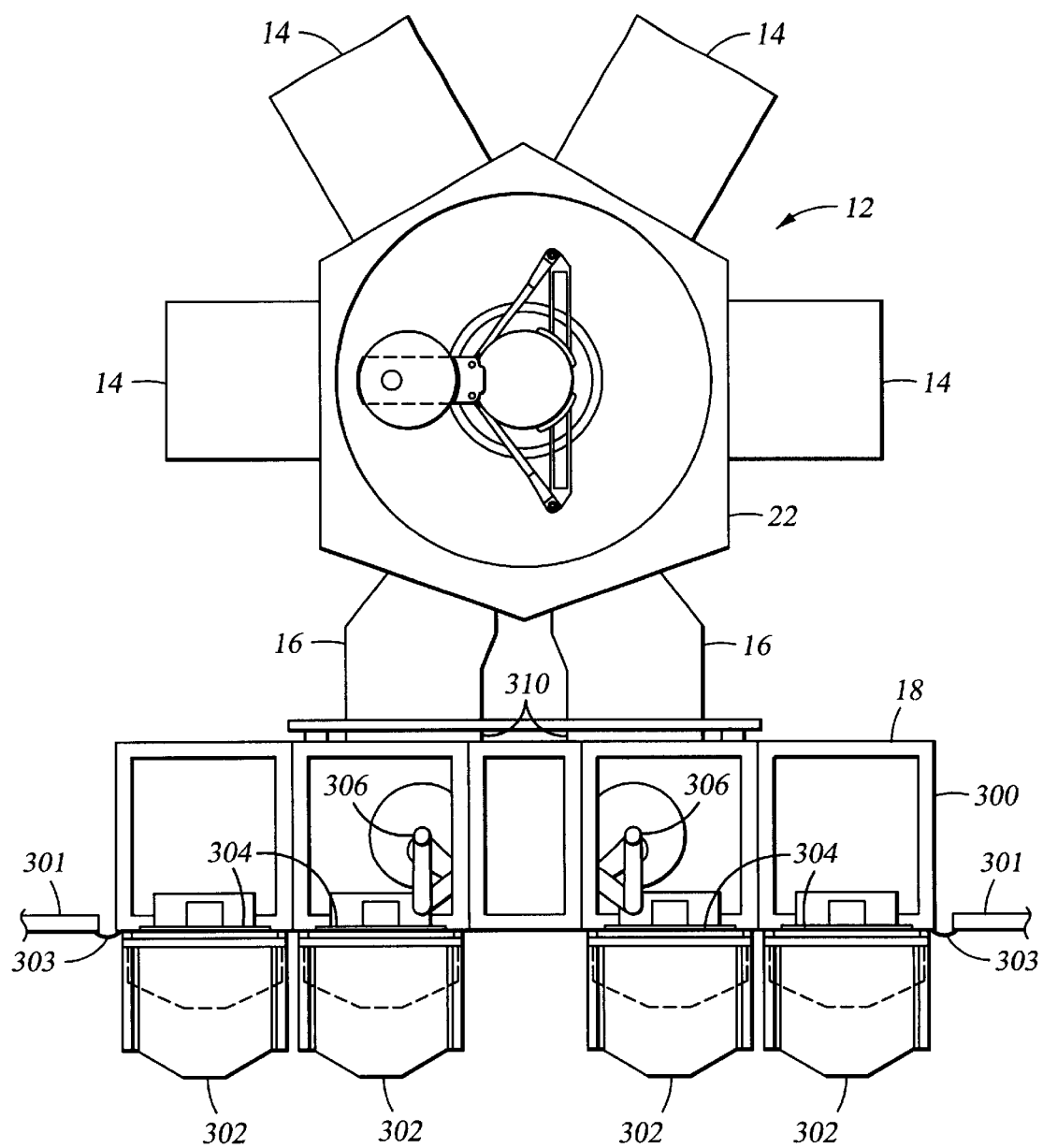
FIG. 1 is a top schematic view of a modular vacuum system.

The present invention generally provides a modular vacuum system which includes both modular hardware and software to expand the capabilities of integrated processing systems by enabling reconfiguration and easy replacement of modules. FIG. 1 is a top schematic view of a modular vacuum system which illustrates one embodiment of modular architecture of the invention. The system is generally comprised of four types of modules; a transfer chamber module 12, one or more process chamber modules 14, one or more load lock modules 16, and a factory interface module 18. Each of these modules has a defined set of functions and interfaces for performing individual processes within their own module and also for coordinating overall performance of the system. The transfer chamber module 12 has interfaces with the process chamber modules 14, the load lock chamber modules 16, the factory interface module 18, and the outside environment and preferably coordinates system activity on the highest level. Each module is designed with its own control system carry out the modules internal processes and which coordinates with the system controller. The invention will be described in more detail below with reference to the hardware first and then to the computer control.

Figure 2:
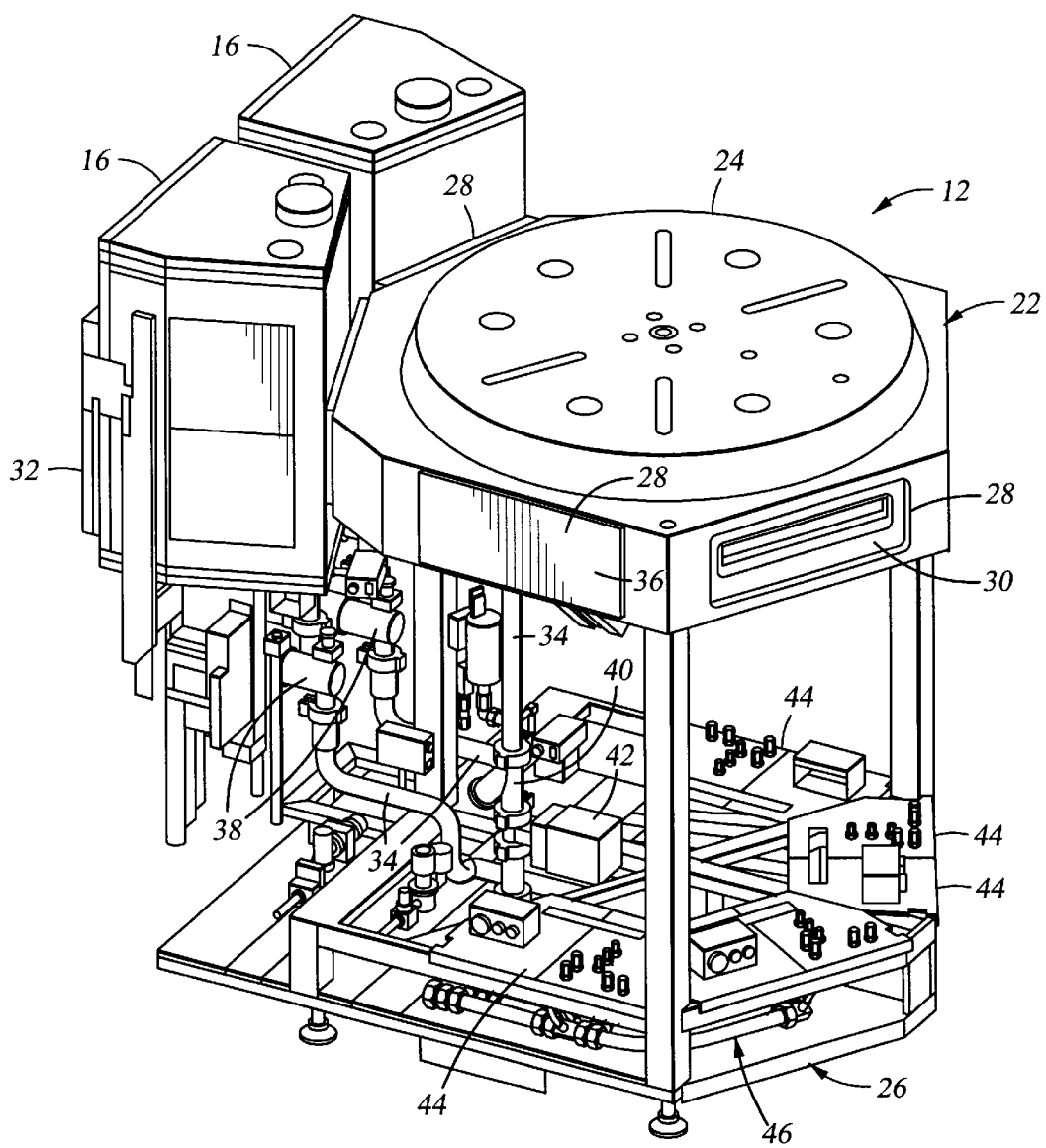
FIG. 2 is a perspective view of a detailed transfer chamber module with load locks.

Physical Interface:

Referring to FIG. 2, an exemplary modular vacuum system generally includes a platform 26, a transfer chamber 22, load lock chambers 16, process chambers 14 (not shown) and all of the necessary facilities and communications supply and return lines and connectors. For clarity, the modular vacuum system is shown without the process chamber modules 14 attached. The transfer chamber 22 includes a lid 24 and several slit valves 28 through which wafers are moved in the system. This embodiment shows a transfer chamber 22 with six facets having six slit valves, one of which is shown, the others having cover plates 36 disposed thereover. The transfer chamber and the platform makeup the central transfer chamber module 12 which preferably serves as the overall controller, although a separate controller can be integrated to control overall system performance.

The process chamber modules 14 are sealably mounted on the transfer chamber 22 at the slit valves 28 and define a passage therebetween to permit wafer transfer. Process chamber modules 14 may include any one of several types of process chambers, such as a PVD chamber, a CVD chamber, an etch chamber, etc., for performing the various types of processes in a series of many processes useful for manufacturing integrated circuits on wafers. It is not unusual for a manufacturer of vacuum chambers to have over twenty different types of process chambers, each with some common features, but which perform different process recipes on wafers. Each process chamber is an individual process chamber module which is responsible for controlling its own processes therein.

The load lock modules 16 are similarly attached at the slit valves 28 and includes a door 32 that opens to the mini-environment 300 (shown in FIG. 1) to permit wafers to pass from the from the mini-environment into the load lock chambers. The load lock chambers mount to a mini-environment 300 which typically is an enclosed clean area with a laminar flow of filtered air which mounts pod loaders 302 and includes pod doors 304 therebetween on one side and includes an opening in the wall of the mini-environment 300 to provide access between the load lock doors 310 and the mini-environment 300. Pod loaders 302 support wafer pods or cassettes (not shown) which hold wafers. Robot 306 moves wafers from the wafer pods through the pod doors 304 and into load locks 16. A robot 306, typically on a track, is disposed therein to move wafers between the pod loaders and the load lock chambers. Alternatively, two robots 306 may be provided to perform the loading/unloading function.

Figure 3:
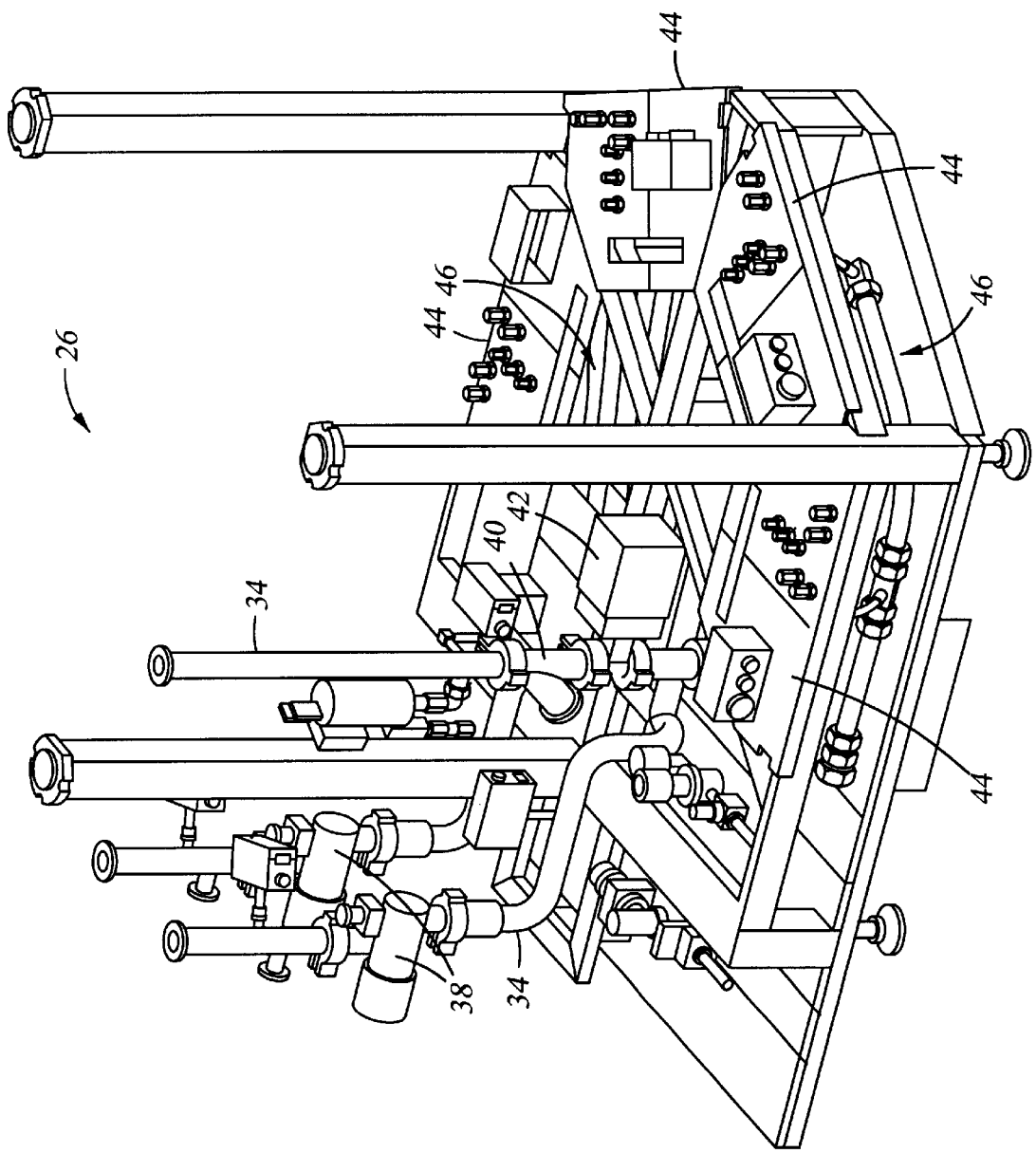
FIG. 3 is another perspective view of a transfer chamber module's platform.
Figure 4:
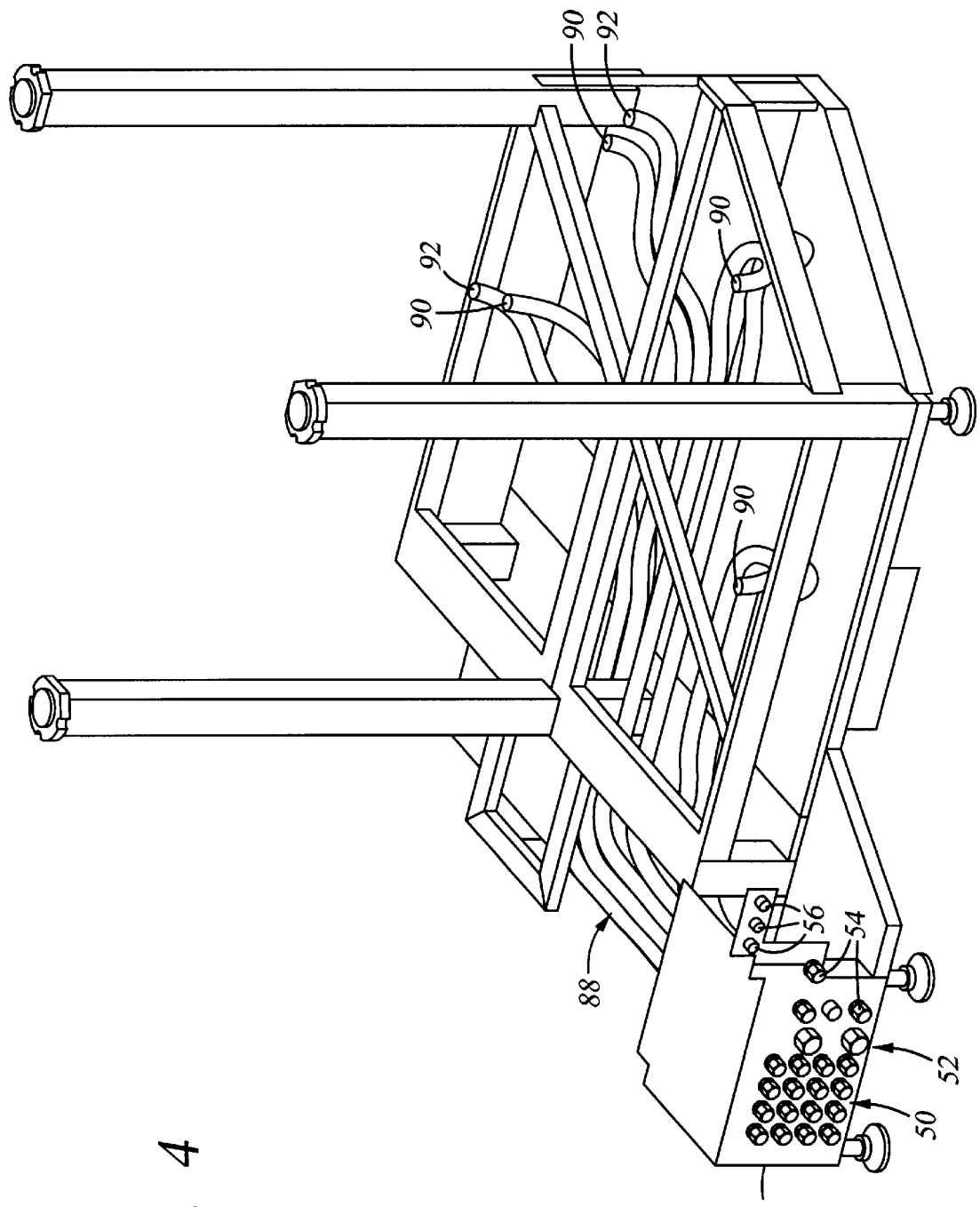
FIG. 4 is a perspective view of a transfer chamber module's platform showing the conduits for a heat exchanger loop.

FIGS. 2–4 are perspective views of the platform 26 more clearly showing common facilities connections for air, water, nontoxic gases and heat exchangers disposed on the lower portion of the platform. The platform includes forelines 34, also known as vacuum lines or roughing lines, which connect the load lock chambers 16 and the transfer chamber 22 to a remote vacuum system such as a roughing pump which is typically located in an area of the fabrication facility known as pump alley. Valves 38, 40 disposed on the forelines 34 control the application of the vacuum pumping system to the load lock modules 16 and the transfer chamber 22, respectively. Throttle valve 42 regulates the rate of evacuation of gases from the transfer chamber 22. The process chamber modules 14 may have their own forelines connected to roughing pumps or they may use a foreline that is provided as one of the common facilities that will be described below.

Conduits 46 disposed within the platform 26 between a facilities panel 48 (shown in FIG. 4) and the interface panels 44 deliver facilities that are required by the process chamber modules 14 to carry out their respective processes. Typical facilities may include chilled water, clean dry air, heat exchangers, and nontoxic gases such as helium, argon, nitrogen and high-purity nitrogen. Facilities conduits 46 connect to the facilities panel box 48 in order to receive the facilities from the manufacturing plant, or fabrication facility. For example, there may be sixteen heat exchanger connections 50 in the facilities panel 48, two supplies and two returns for each interface panel; two chilled water connections 52, one return and one supply; four clean dry air connections 54, two supplies and two returns; and three nontoxic gas connections 56, one each for helium, argon/nitrogen, and high-purity nitrogen. The vacuum forelines 34 provide the return lines for the nontoxic gases. Each type of process chamber module 14 has a unique set of total facilities requirements, however, many have very similar total facilities requirements.

Figure 7:
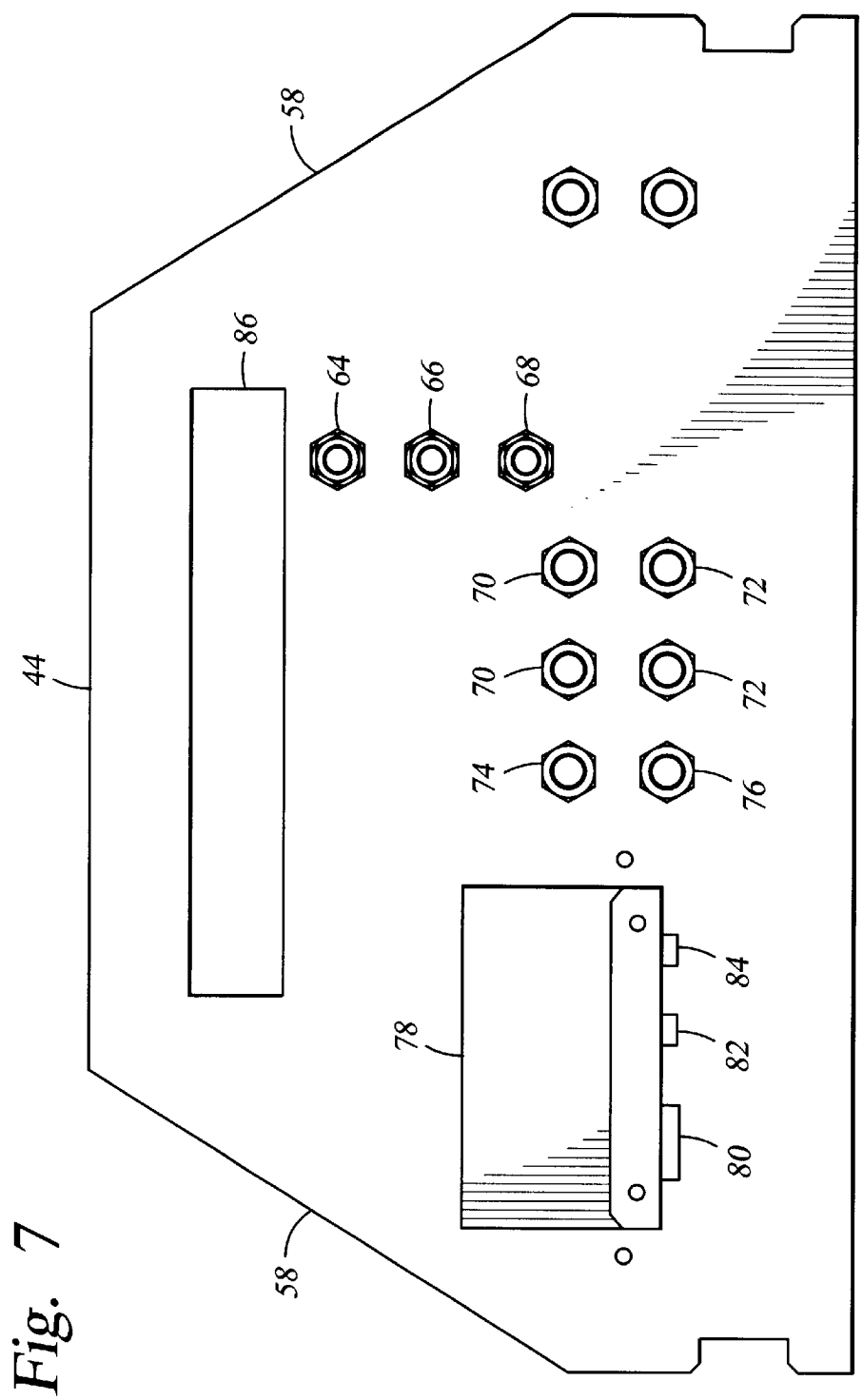
FIG. 7 is a top schematic view of an interface panel.

Interface panels 44 provide an interface between the facilities and the facility connections on the process chamber modules 14. Conduits 46 may terminate at the interface panels 44 at a set of interface panel connections. FIG. 7 is a schematic top view of one embodiment of an interface panel 44. The interface panels 44 are mounted on the lower portion of the platform 26 at each process chamber position. In the embodiment shown, the panel sides 58 are angled in order to mount adjacent to each other on a hexagonal platform layout. Several connections for typical facilities are shown on the interface panel 44, but it is to be understood that other numbers of connections or types of facilities may be used without departing from the spirit of the invention.

Electrical connection box 78 is preferably disposed on the interface 44 to provide the common connections for various types of electrical signals which are required by a process chamber module 14, such as a chamber interlock interconnect 80, emergency-off 82, and network connector 84. The wiring or conductors typically run under the interface panel 44 and into the electrical connection box 78. The chamber interlock interconnect 80 permits the transfer chamber module 12 and the process chamber module 14 to exchange information on their respective interlocks that prohibit one chamber from performing a task when the other chamber cannot allow it. The emergency-off connection 82 may provide a signal to the power supply to shut off the electrical power when either the operator or the chamber's control system has encountered a serious problem in the system. The network connector 84 may be a standard connector that the control system may use to communicate with the various modules of the vacuum system over an ethernet 10baseT line.

A passage 86 is disposed through the interface panel 44 to enable an optional subpanel to be inserted therein to provide additional configuration capability in the panel 44. Since, each different process chamber module 14 has a unique set of total facilities requirements, occasionally a chamber module 14 may require an additional facility which must be routed and connected to the chamber. Thus, the subpanel may have different gas bulkhead connections, providing optional interface facility connections, that are not common between many of the different process chamber modules 14. Different optional subpanels may provide different optional interface facility connections.

Figure 8:
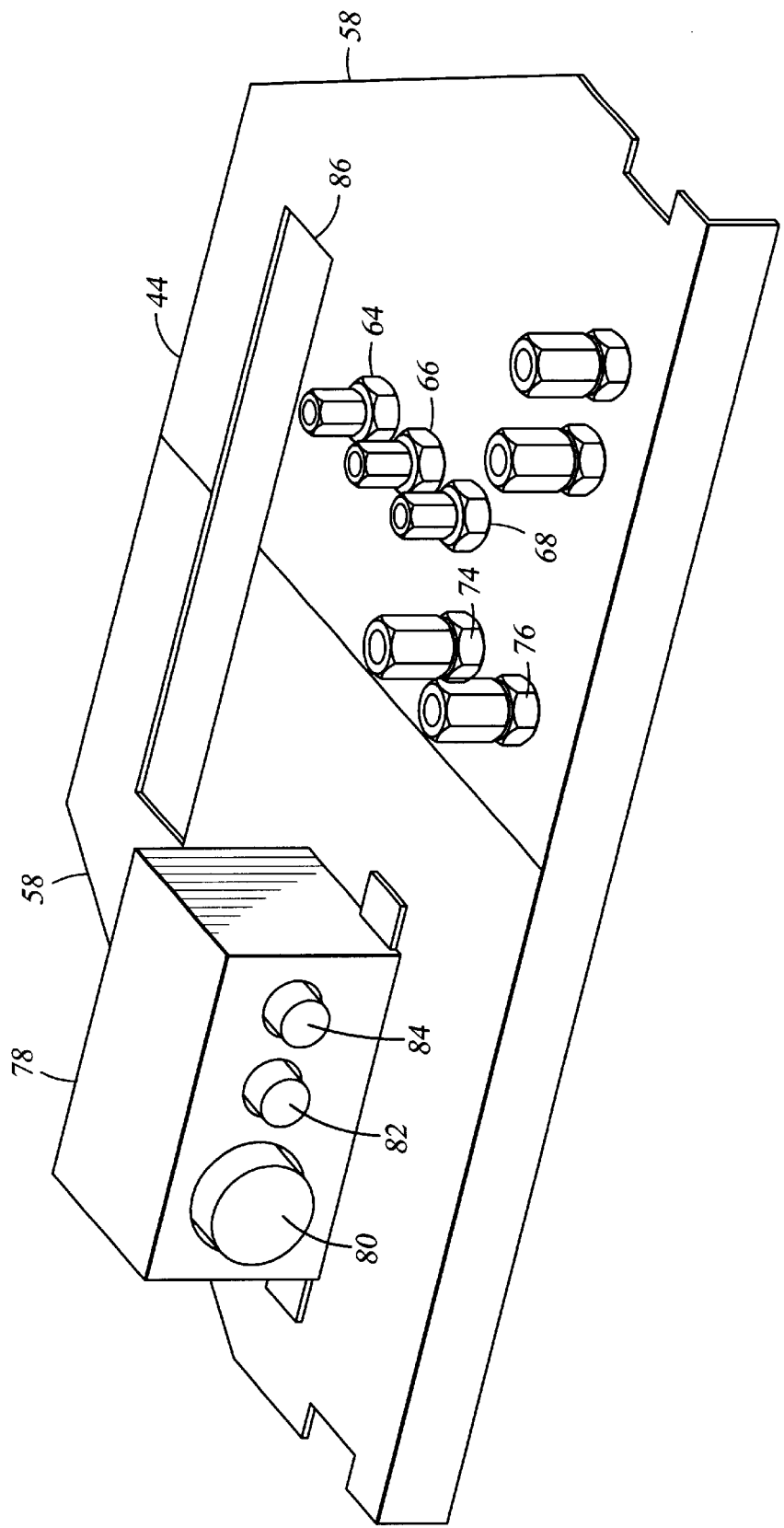
FIG. 8 is a perspective view of an alternative interface panel.

FIG. 8 shows a perspective view of an alternative embodiment of an interface panel 44. This figure shows some of the facilities connectors that may be used in the panel without the four heat exchanger connectors 70,72 (shown in FIG. 7) in order to illustrate one alternative configuration in which the heat exchangers are routed directly to the chamber modules 14.

FIG. 4 shows platform 26 with facilities panel box 48 and one heat exchanger loop 88 for each interface panel 44. The interface panels 44 have been removed to show the tubing, or lines, for the heat exchanger loops 88. Sixteen heat exchanger connections 50, eight inlets and eight outlets, are provided for the tubing, so in this embodiment, connections 50 have been provided for two loops to each interface panel 44, but only one loop 88 per panel is shown for clarity. Either or both of the loops may be insulated if necessary, and may provide a flow of fluid up to four gallons per minute per chamber. Each panel 44 is provided with a heat exchanger supply line 90, matching up with one of the heat exchanger supply connections 70 on the panels 44; and each panel 44 is also provided with a heat exchanger return line 92, matching up with one of the heat exchanger return connections 72 on the panels 44.

Figure 5:
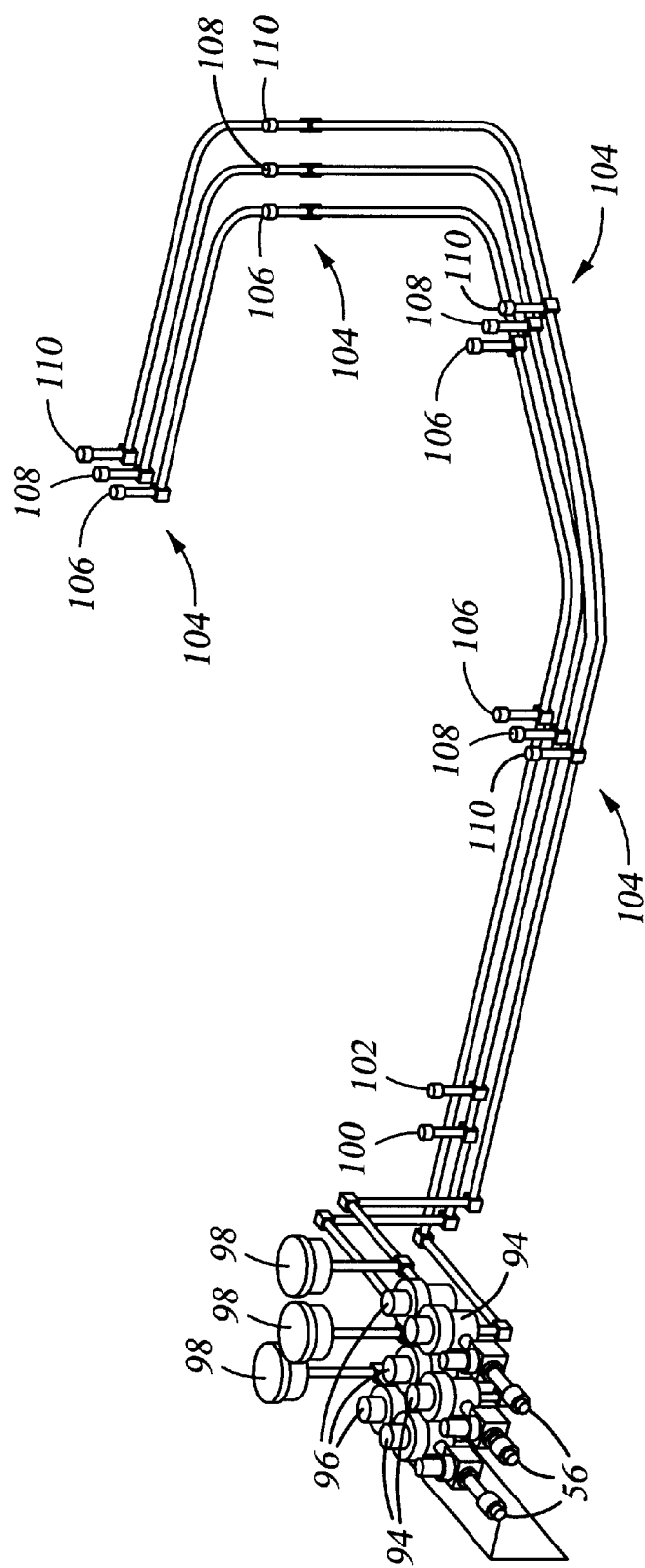
FIG. 5 is a perspective view of nontoxic gas conduits.

FIG. 5 shows the delivery lines 106, 108, 110 for the nontoxic gases, such as argon, nitrogen, helium, and the like, with the platform 26 removed for clarity. Connectors 56 mount to the facilities panel box 48 as shown in FIG. 4 to enable quick and easy connection to facility lines from a gas panel (not shown) in the manufacturing plant. The delivery lines 106, 108, 110 extend from the facilities panel box 48 to the interface panels 44. There are four sets of interface panel connections 104, one for each interface panel 44. In this embodiment, three nontoxic gas supplies are provided, one each for helium 106, high-purity nitrogen 108, and argon/nitrogen 110. These supplies are connected to the interface panel 44 at connectors 64, 66 and 68, respectively, as shown in FIGS. 7 and 8. In the high-purity nitrogen supply 108, purge valves 100 and 102 may be provided for the transfer chamber and the load locks, respectively, so that nitrogen purge gas may be delivered to these chambers. Each nontoxic gas line may be provided with a valve 94, a regulator 96 to regulate the flow of the gas, and a pressure gauge 98 to monitor the gas pressure in the lines. The pressure gauge 98 may be dial or digital and typically measures pressures in the range of 0–100 psi. The regulator 96 may regulate the gas to about 0–30 psi. Each line may additionally have point-of-use filters.

Figure 6:
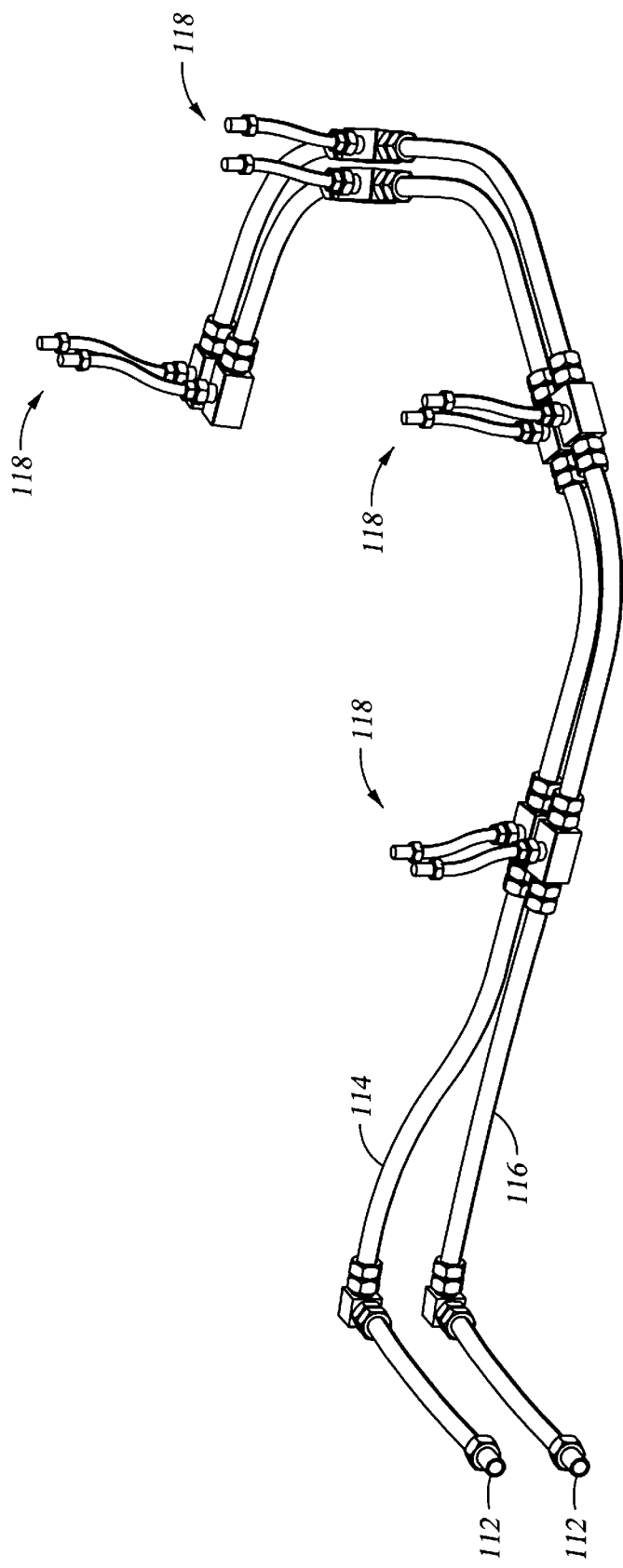
FIG. 6 is a perspective view of chilled water conduits.

FIG. 6 shows the tubing for chilled water. This tubing may be flexible, with or without insulation, and sufficient to provide the chilled water at a flow of up to ten gallons per minute per chamber. Connectors 112 connect to facilities panel box 48 at connectors 52. A supply line 114 and a return line 116 are provided. A set of connectors 118 is provided for each interface panel 44 and match up with connectors 74 and 76 in FIGS. 7 and 8.

The tubing for the clean dry air is not shown since it usually requires very simple tubing that may be any suitable material that can supply the clean dry air at a regulated pressure that may be about 0–100 psi. For example, rubber or plastic tubing can be routed from the panel 48 to each of the interface panels 44.

The facilities provided in the embodiment shown in the above description is just one possible combination. The actual facilities chosen may be designed with the simplest configuration of facilities to satisfy the most common requirements of the chambers that are expected to be used in the vacuum system.

Figure 9:
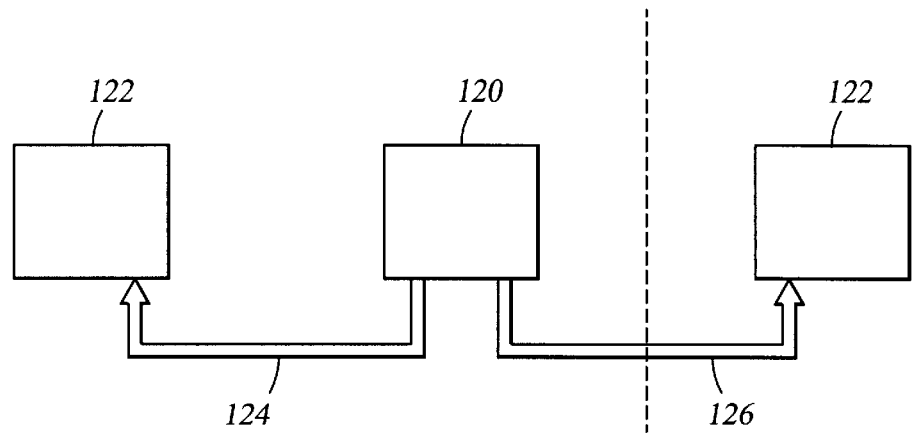
FIG. 9 is a schematic of a modular vacuum system with a modular power supply system.

Power Interface:

FIG. 9 shows a general schematic for supplying electrical power to a modular vacuum system. A modular power supply system 120 provides electrical power over cables 124 to the modular vacuum system. The modular power supply system 120 comprises separate power supply modules 122, each providing power to separate vacuum chamber modules 12, 14 and 16. With this modular design, a modular power system 120 may be scaled to the needs of the modular vacuum system. If the users only need to put two process chamber modules 14 on the transfer chamber module 12, then only two power supply modules will be needed, and only two cables will be needed to supply the power modules with electricity.

Figure 10:
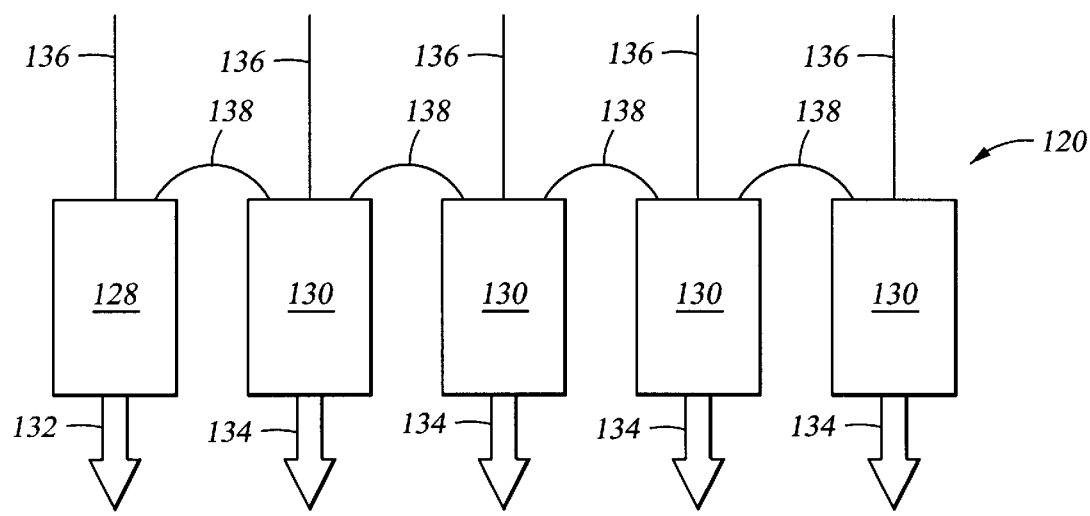
FIG. 10 is a schematic of a modular power supply system.

FIG. 10 shows a general schematic of a modular power supply system 120. Five power modules 128, 130 are shown in this embodiment, but it is to be understood that a different number of modules may be used as necessary. One power module is provided for each of the modules.

The transfer chamber module 128 provides all of the electrical power and functions to the mainframe of the vacuum system over cables 132. The other power modules 130 provide electrical power and functions to the various process chamber modules 14 over cables 134. Each of the power modules 128, 130 receives its power from a source from the manufacturing facility, or building, over cables 136. The total amperes on each cable 136 may be different, depending on the type of chamber module being served, but typically may vary between 100 amps and 600 amps, while the voltage may typically be about 208 volts AC or 480 volts AC.

The transfer chamber module 128 may be called the master module and each of the other power modules 130 may be called slave modules. Thus, the transfer chamber module 128 can control each of the slave modules 130 with signals sent over a master/slave cable interconnect 138. The interconnect 138 provides a signal from the transfer chamber module 128 preventing the other power modules 130 from powering-up their respective process chambers 14 when it is not advisable to allow the process chamber modules 14 to power. Thus, although each chamber power module 128, 130 is provided with its own on/off switch, only the switch on the transfer chamber module 128 immediately powers-up its chamber module, while the other on/off switches of modules 130 remain inoperative until the other modules 130 receive a signal over interconnect 138 indicating that the transfer chamber module 128 has successfully completed powering-up its chamber module.

Each of the power modules 128, 130 is provided in its own cabinet in which is disposed all of the breaker switches, control devices, busses and other electrical power devices needed for providing power to its corresponding chamber module. Additionally, each cabinet has a standard height and depth, such that two cabinets may be joined together at their sides in order to provide physical stability to the cabinets. The cabinets may be of any width since the widths of the cabinets do not affect joining them at their sides. As an example, if each module cabinet is 72 inches high by 18 inches deep, then it may be attached to another cabinet, because they match up. The widths may be different, 16", 24" or 36", so each module may be tailored to its own specifications. If a particular modular power system has several power modules, then they may be attached together in a single bank of modules.

Figure 11:
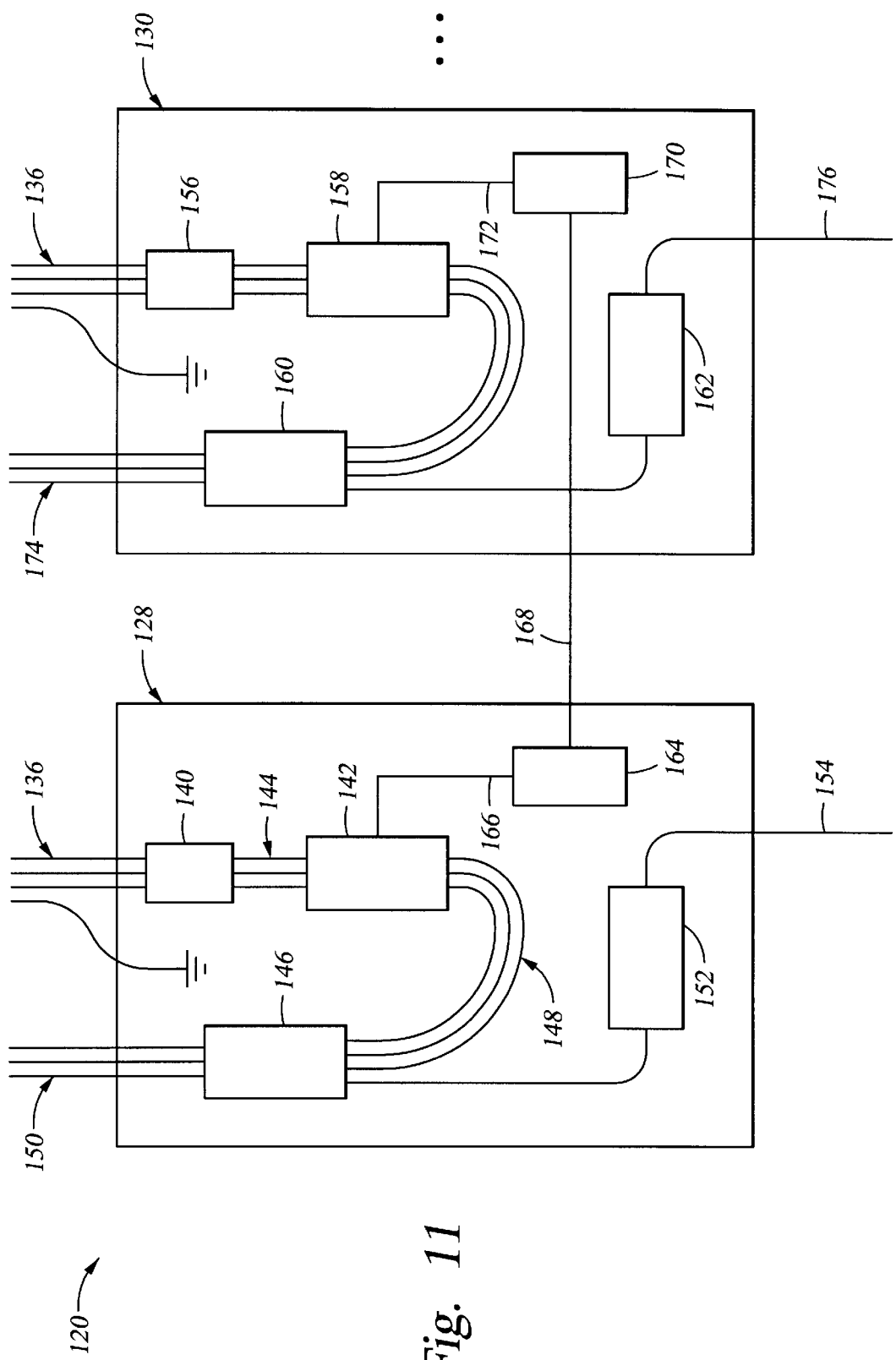
FIG. 11 is a schematic of two power supply modules for two chamber modules.

FIG. 11 is a schematic drawing of a modular power supply 120 showing just the transfer chamber power module 128 and one of the other modules 130. The transfer chamber power module 128 receives the manufacturing facility's power source over cables 136 to circuit breaker 140. Contactor 142 receives the electricity from circuit breaker 140 over lines 144. Distribution circuit breakers 146 receive the electricity from contactor 142 over lines 148. Distribution circuit breakers 146 distribute the electricity, either the 208 volts AC or the 480 volts AC, to the transfer chamber module 12 over lines 150. Distribution circuit breakers 146 also send the electricity to uninterruptible power supply (UPS) 152, which sends a 120 volts AC supply to the transfer chamber module 12 over lines 154.

The process chamber supply modules 130 may be similar to the transfer chamber power module 128, but are tailored to the specific needs of the process chamber 14 for which they provide power. In other words, circuit breaker 156, contactor 158 and distribution circuit breakers 160 function similarly to the elements in the transfer chamber power module 128. Power module 130 may even have a UPS 162 if desired. Lines 174 provide the 208 volts AC or 480 volts AC to the process chamber module, and lines 176 provide a 120 volts AC to the process chamber module 14.

Transfer chamber module 128 has an emergency-off (EMO) master circuit 164 for providing a 24 volts AC signal to contactor 142 over lines 166. This signal causes contactor 142 to make contact and permit the current from circuit breaker 140 to flow forward. In the event of an emergency shut-down, EMO master circuit 164 opens and cuts off mainframe power. This emergency procedure may be done by a user of the system who has detected a problem or automatically by the controller for the system 10. Likewise, in the event of an emergency shut-down, EMO master circuit 164 sends a signal over lines 168 to EMO slave circuit 170 commanding circuit 170 to send a signal over lines 172 to contactor 158 to open and cut off power to the process chamber modules 14.

Figure 12:
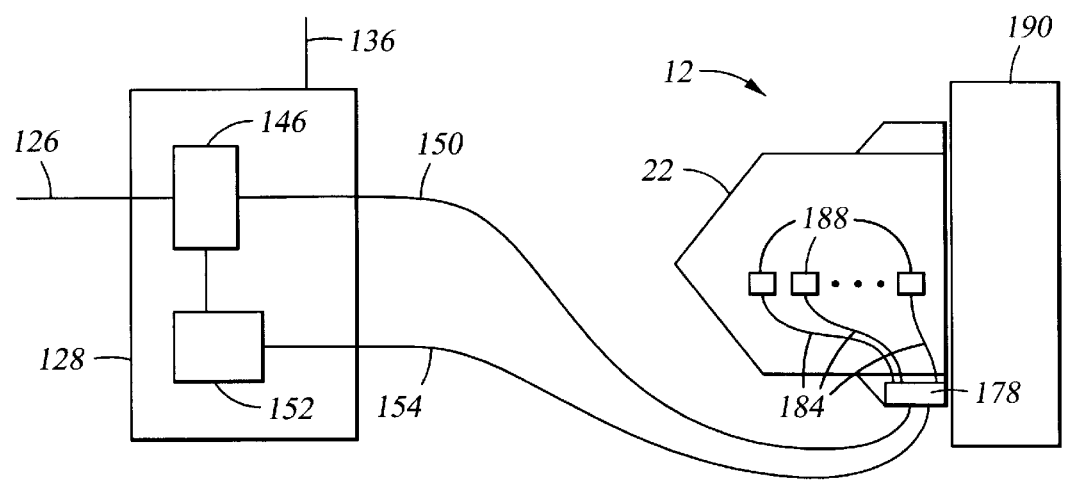
FIG. 12 is a schematic of a power supply module and a chamber module.
Figure 13:
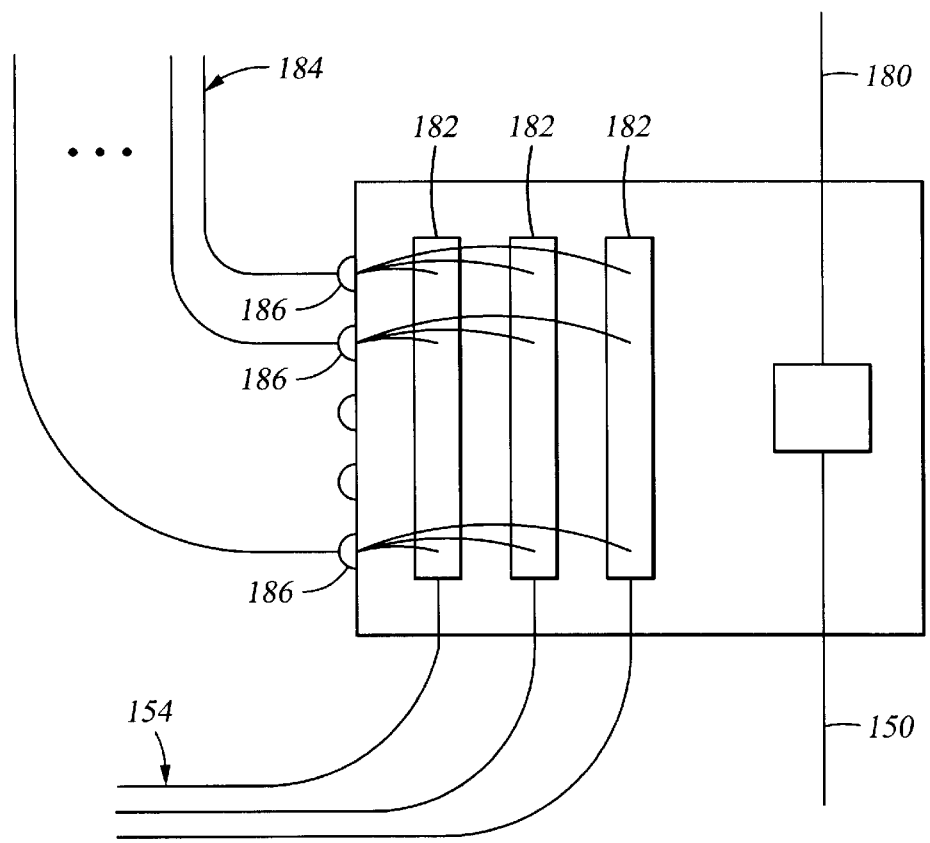
FIG. 13 is a schematic of a power distribution unit in a chamber module.

FIG. 12 shows a simplified schematic of a transfer chamber power module 128 and a transfer chamber module 12, wherein lines 150 and lines 154 deliver the 208 volts AC (or 480 volts AC) and the 120 volts AC to the power distribution box 178 of the transfer chamber module 12. FIG. 13 shows an enlarged schematic of power distribution box 178. The 208 volts AC (or 480 volts AC) supply comes in over lines 150 and is sent over lines 180 to the transfer chamber module 12, usually in the event that the transfer chamber 22 has a heater. The 120 volts AC supply comes in over lines 154 to hot/neutral/ground bus 182. Lines 184 connect to bus 182 through fuses 186 in order to send the 120 volts AC supply to the required devices 188 in the transfer chamber module 12. Additionally, any factory automation device 190 that brings the wafers to the vacuum system and takes the wafers away may also take its power from the transfer chamber power module 128. The transfer chamber power module 128 may also supply power to the remote area 122 over lines 126 (as shown in FIG. 9) to power the vacuum pumps for the transfer chamber module 12 and possibly to power any heat exchanger.

A power distribution box similar to the power distribution box 178 on the mainframe distributes power for each process chamber 14, depending on the needs of each individual chamber.

The modular vacuum system may be made modular by providing each chamber module with all of the elements and connections necessary to bring one chamber module up next to the transfer chamber and quickly connect the chamber modules together at their slit valves and at their facilities and communications connections. Each chamber module preferably has a corresponding power supply module in a modular power supply system and the addition or deletion of a chamber to or from the modular vacuum system may require a corresponding addition or deletion of a power supply module.

Control Interface:

A modular control system for controlling the modular vacuum system is provided by creating objects in software representing each of the modules of the modular vacuum system. Each representative object comprises a plurality of sub-objects, or sub-modules, representing each of the devices or functions of the modules as described in more detail below. A user of the system may build objects from a database of pre-programmed objects provided by the manufacturer along with each chamber or system, so that the general process chamber will perform a specific process. A host controller, preferably comprising a central cluster module, launches these objects as computer processes in the computerized control system of the modular vacuum system.

The central cluster module preferably controls the activity of the system and is also responsible for maintaining a suitable environment for manipulating wafers to and from the load lock modules and the process chamber modules. This includes management of the pressure in the central cluster, introduction of purge gasses when required, and management of the isolation valves between the central cluster and the other attached modules. In addition, the central cluster module is responsible for moving the wafers to and from the attached modules, i.e., the load lock modules and the process modules. Finally, and most importantly, the central cluster module is responsible for system control which is the high level control that coordinates the actions of the if other modules as well as providing the interface to the outside environment. To accomplish these functions, the central cluster module has interfaces to each of the other modules as well as the outside environment, which is typically referred to as the fabrication facility ("Fab"). Each process chamber module is adapted to physically mount to the transfer chamber as described above and is connected to the control system through the electrical connections provided on the interface panel 44. The load lock chambers 16 are similarly mounted to the transfer chamber 22 and may include a vacuum/vent interface which is controlled by the load lock chamber module or through the central cluster module.

Each of the physical vacuum chamber modules is represented by and controlled by a virtual chamber module in software called objects and run on one or more controllers. Preferably, the individual objects run on the central cluster module controller which runs a main system level process to perform system-wide functions, such as wafer handling and coordination of processes occurring in each module. The objects communicate with the system level controller under the control of their own software managers. Such communication may follow any desired data transfer protocol which provides the interface between objects and defines the software boundaries between modules. Furthermore, each object is executable and is stored in a database of objects, so it may be quickly loaded by the system level into a controller and initiated as a process within the system. Thus, changing the physical configuration requires merely calling a different object from the database or a remote storage device and initiating it as a new process in the controller. With the software modularity added to the physical modularity, the overall system becomes very flexible and easy to configure and reconfigure.

Figure 14:
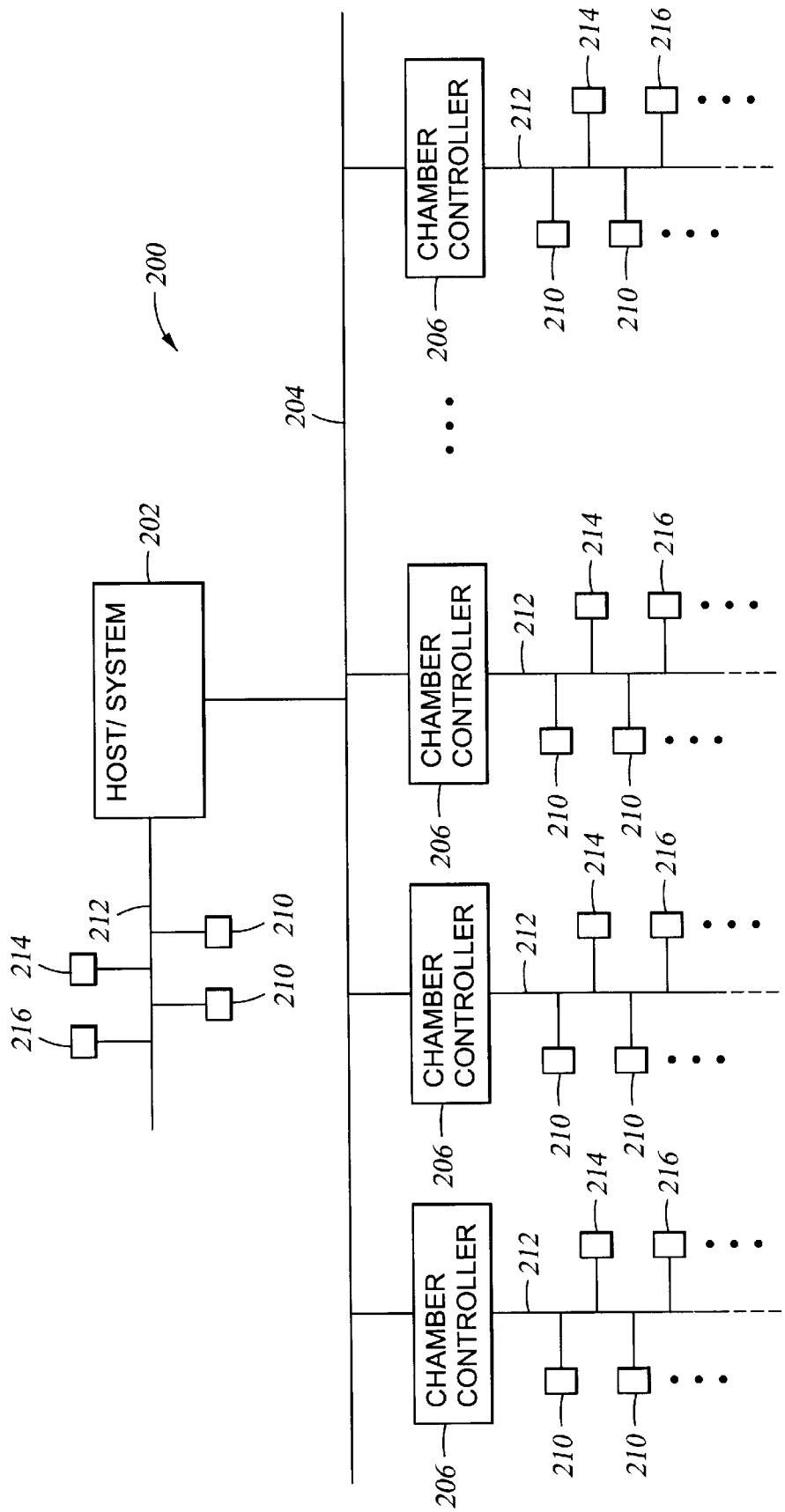
FIG. 14 is a schematic of a modular control system.

FIG. 14 shows a physical hierarchy for a modular control system 200 with a host controller 202 for controlling the overall operation of the modular vacuum system 10. Preferably, the host controller comprises the central cluster module controller. However, a separate host controller can be used. In one embodiment, the modular control system 200 is a multi-processing device which connects to an ethernet backbone 204 for communicating with the rest of the system 200. The host controller 202 provides the front end station for the control system. It may be, for example, a Unix system running on a Sun Sparc station.

Individual chamber controllers 206 are provided for each module in the system. These controllers 206 may be running VxWorks™ on a Motorola 68030™ based system or Intel™x86-based system. Each of these controllers 206 communicates with the host controller 202 over the ethernet backbone 204 and with the individual devices 210 of each of the chamber modules over DeviceNet subnetworks 212. This device level is also known as the application level. Controllers 206 also communicate with the modular power system 120 through devices 214 to the respective power modules 128, 130 of each of the chamber modules. Controllers 206 also monitor the chamber interlocks over monitors 216.

The control elements 210, 214, 216 for the central transfer chamber module 202 are associated primarily with wafer handling and environment management. The control elements 210, 214, 216 for the process chamber controllers support similar tasks in conjunction with other specific process needs.

DeviceNet is an open protocol maintained by the Open DeviceNet Vendor Association for a sensor bus, which allows several devices (such as motors, sensors, heaters, lamps, etc.) in a system (such as a vacuum processing system) to communicate over a single bus with a controller that provides commands to the devices to perform their operations (such as turning on, turning off, rotating certain angles, etc.) and receives feedback from the devices concerning system operation (such as wafer position, actual gas flow rate, temperature, etc). The controllers 206 send commands over the DeviceNet network to control the functions of the individual devices. Device manufacturers have begun to make individual devices with built-in intelligence, so the controllers 206 may send standardized commands over the DeviceNet network in order to cause the devices to interpret the commands for themselves and to perform the task specified by the command, including providing the controllers 206 with information about their own self-diagnostics. With such built-in intelligence, it becomes possible to substitute devices within a chamber module without having to reprogram the controllers 206, thus, providing an avenue toward device-level modularity. Another sensor bus that may be used with or instead of DeviceNet is Seriplex available from Square D Company of Raleigh, N.C.

Each chamber module has a myriad of sensors and actuators placed within it to monitor the status of the module and control the devices within the module. In current systems, a chamber and its devices typically have several sensors tied through a single I/O card in a VME rack. With an increase in the number of sensors in a chamber module, the VME rack with I/O cards has become unmanageable since so many wires have to run into the rack. With DeviceNet, however, a series of digital I/O blocks are arranged in the chamber module and attached to a single bus line. Each digital I/O block has an address which the controller 202, 206 can send a command to or receive data from. Thus, several digital I/O blocks may be put on a single DeviceNet network. Additionally, each digital I/O block has only a few sensors or devices placed on it, so the system remains easily manageable.

FIG. 15 shows a logical hierarchy for a modular control system 200 similar to that shown in FIG. 14. The system level 218 is the logical level that corresponds to the host level 202 in the physical hierarchy. The chamber objects 220 correspond to the controllers 206 so that a chamber is represented by an object in the software. The manager modules 222, controller modules 224, driver modules 226 and I/O modules 228 are virtual devices that cause the chamber modules to perform and monitor their functions, from high level commands down to the device-specific I/O signals.

The host controller has its own chamber object 220 for the transfer chamber module, and each process chamber module is represented by a corresponding chamber object 220. Thus, the modularity of the vacuum system is maintained across essentially corresponding lines between the physical system and the logical system. The system level 218 may be a workstation performing the functions of the host controller 202 and includes application functions, server processes and database functions.

The application functions of the system level 218 include providing an interface for a user to access and operate the machine such as a graphical user human/machine interface (GUI). The GUI provides the user with all of the commands for creating the desired vacuum system processes to fully perform integrated operations on wafers. The application functions also provide a sequencer which sets forth a method that determines where a wafer needs to be transported in the vacuum system and which communicates instructions for performing this method by the objects 220. The information is provided by the recipes in the control data, which will be described below. The application functions also track the history of the wafers that have been processed in the system and stores the data in the wafer history database. The applications functions also communicate outside the system to the manufacturing facility through a Semiconductor Equipment Communication Standard or a Generic Equipment Model (SECS/GEM) communication protocol for semiconductor equipment.

The server processes of the system level 218 include a configuration manager, an ID generator, a wafer manager, event dispatching, event logging and a status monitor. These functions essentially cause the chamber objects 220 to perform their functions. For example, the configuration manager keeps the run-time configuration of the system. After the desired configuration for a vacuum system is generated by a user, it is sent to the configuration manager to interpret the configuration data as it runs and provide instructions to other processes for performing their functions.

Each chamber object 220 has an ID for addressing the objects. The identification generator generates the ID's for the chamber objects 220 based on the name or type of the object and where it is in the hierarchy described below.

The wafer manager tracks a wafer through the vacuum system and provide data on wafer status and location to the wafer data database and the wafer history database, which will both be described below.

The event dispatching responds to events as they are generated and performs the processes for handling the events. Event dispatching may handle unexpected events that may be generated such as when an alarm or warning goes off, and it may handle expected events such as an indication that the vacuum system has finished processing a load of wafers and is ready for it to be removed and a new one put in its place.

Event logging saves any information surrounding an event, such as when the event occurred, where it occurred, what type of event occurred. This information may be saved in the database.

The status monitor essentially checks the heart-beat of the entire system. It is a program that checks to make sure all processes in the vacuum system are operational.

The database functions of the system level 218 include handling wafer data, configuration information, multi-language strings, wafer history, control data and an event log. The database is essentially keeping track of the past, present and future of the entire system. In short, the database stores all of the information relevant to the modular vacuum system. The wafer data includes the current status and location of each wafer in the system, e.g., where the wafer is, what has been done to the wafer, and what is going to be done with it in the future. The wafer data database may log the information from the wafer manager, above.

The configuration information may store all of the possible instances and equipment constants for the vacuum system. This information essentially defines the system that the vacuum system manufacturer has made for the fabrication facility.

The control data includes the recipes, i.e., the processes that are to be performed on the wafers, the sequences (the different recipes strung together in their proper order) and the interlocks (the safety precautions in the cross-talk between the various chambers) for the system.

The system level 218 configures the system 200, including the chamber objects 220 and all of the modules 222, 224, 226, 228, and launches the configured objects and modules within the control system 200. The system level 218 locates and distributes the software objects 220 within the hardware of the system 200. Theoretically, since each controller 206 is represented by an independently running object 220 on a multi-processing system 200, the objects could physically run on any processor in the system 200. The system level only needs to know where each object is. However, the system level 218 may distribute the objects 220 to the corresponding chamber module's controller 206. The communication from one object 220 to another is handled by the system level.

The chamber objects 220 are software objects made up of a hierarchical set of modules 222, 224, 226, 228 and define what type of chamber module is represented, such as a PVD module, a CVD module, an etch module, etc. The objects 220 also define the process to be performed by each chamber and the many attributes for their particular type of chamber. The attributes may include the amount of time that a plasma is to be turned on, the pressure at which the chamber is to be maintained, the position at which the lift pins are to stop, plus almost a thousand other possible attributes.

The chamber objects 220 provide the signals and commands to actuate the operation of the various chamber modules and have the same general form. Even the transfer chamber module 12 is represented by just another variant of a chamber object 220. The operation of the objects 220 begins with a high-level command that is interpreted into successively lower-level commands until the actual electrical signals are provided to the physical devices in the chamber module.

The chamber objects 220 comprise manager modules 222, or subobjects which provide the high-level commands for managing the various functions of a chamber module. These functions are the subsystems of the vacuum chamber modules. For example: a port manager in the transfer chamber module manages the communication interface and data transfer protocol between the transfer chamber modules and the process chamber modules in the system; a service manager maintains a list of and manages the execution of system services such as special recipes and templates for recipes; a report manager manages the movement of blocks of data between controllers, such as a one-time block movement or periodic block movements; an interlock manager manages the communication of interlocks and the determination of whether an interlock has been violated and the communication of interlock events back to the system level; a process manager manages the steps of a process in the manufacturing of a wafer by actually running the recipes and templates; an event manager is the real-time component of the event logging process in the system level, so events generated by a device driver are actually handled at this level; a fault manager manages the response to faults in the system in a similar manner that the event manager handles events; and a command manager accepts the SET and GET commands when the system level sends commands to set the attributes of an object to particular values, or sends a command to get the attributes of an object in order to view them.

The manager modules 222 comprise controller modules 224 which provide the various mid-level commands for carrying out the general functions of the manager modules 222. The controller modules 224 define the specific steps for the high-level processes. For example: the process manager may need to control the pressure in the chamber, or the movement of a lift or of a robot in the chamber, or the flow of gas in the chamber. For an ultra high vacuum process such as physical vapor deposition (PVD), a pressure control module will bring the pressure down to an ultra high vacuum, or a lift controller will operate a lift to raise the wafer near a target, or a gas flow controller will flow gas into the chamber to return it to the lower vacuum.

The controller modules 224 comprise driver modules 226 which provide the various low-level commands for carrying out the mid-level functions of the controller modules 224. The driver modules 226 may even represent actual devices 210 within a chamber module as compared to the more abstract processes or functions of the controller modules 224 or of the manager modules 222. For example, in order for the pressure control module to control the pressure in a chamber, a valve driver module may have to be called to operate the valve to the pump. For a gas flow control module to control the flow of gas, another valve driver module may have to be called to operate the throttle valve 42. For another example, in order for a lift controller module to change the position of a lift, a motor may need to be driven. Thus, a motor driver module may have to be actuated by the controller module.

The driver modules 226 comprise I/O modules or devices 228 and interface between the software and the actual hardware. The I/O modules 228 are hardware that provide the actual electrical signals for causing the actual physical devices 210 to perform the commands of their corresponding driver modules 226. The I/O modules represent cards that provide the electrical signals, such as digital-input/digital-output (DIDO) cards, or analog-input/analog-output (AIAO) cards. For example, among other functions, DIDO cards receive signals from sensors telling whether a wafer is in a chamber or whether a wafer is on a robot blade or may send on/off commands to the pneumatics systems. AIAO cards, among other functions, receive signals indicating the pressure reading of a gauge or the actual flow rate at a mass flow controller or send a signal telling the mass flow controller to flow at a certain rate. As another example, in order for a motor driver module to actuate the motor, the motor I/O module may send a 10V signal on a particular line. In another example, an I/O module may send and receive signals to and from the DeviceNet network or another sensor bus.

Additionally, if the user of the system wants to change or add a command that a process manager module may issue, then the creation of the new command may be a simple matter of rearranging existing modules. For example, if the process manager module is currently only capable of sending commands to move the robot from chamber A to chamber B and from chamber B to chamber C, but the user wants to have a single command to move the robot from chamber A to chamber C, then a very simple new command may be added to the process manager module. Then the robot controller module may be changed to support this new command by simply detecting a different change in the angle of position. The modules that the robot controller module uses at the driver and I/O levels to perform the new command could be the same modules used for the old commands. Thus, adding a new function or command may be a simple process of writing in a new module at one level and incorporating existing modules below it.

Likewise, changing out one chamber module 14 for another chamber module 14 may be just as simple as changing out a device or command. The system level 218 merely distributes a new object, configured by the operator from existing modules, to operate the new chamber module. Thus, the changing of a chamber in a modular vacuum system 10 as shown herein involves three basic parts: positioning a chamber module 14 at the slit valve of the transfer chamber module 12; attaching the connections including gas lines, fluid lines and the communication bus, as well as other cables and lines; attaching a corresponding power supply module 130; and assigning a corresponding chamber object 220 to control the chamber. This system provides great improvement over the prior method of changing a chamber that required a lot of time to reconfigure the transfer chamber's platform with new facilities, tubes and cables; and a lot of time to rework a single, bulky power supply unit; and a lot of time to reconfigure the controlling software.

While the foregoing is directed to the preferred embodiment of the present invention, other and further embodiments of the invention may be devised without departing from the basic scope thereof, and the scope thereof is determined by the claims which follow.

What is claimed is:

1. A modular vacuum system for processing substrates, comprising:
   a central transfer chamber module comprising;
      a platform;
      a central transfer chamber supported on the platform and adapted to be coupled with at least one chamber module; and
      a robot disposed in the central transfer chamber for moving substrates through the system;
   a facilities panel box disposed on the platform and adapted to be coupled to facility lines;
   a plurality of interface panels supported on the platform, each interface panel adapted to be coupled to each chamber module; and
   at least one delivery line, each delivery line supported on the platform and adapted to be coupled to the facilities panel box and to each interface panel.

2. The modular vacuum system of claim 1, further comprising one or more chamber modules coupled to the central transfer chamber module, each chamber module having a chamber controller and an interface connecting each of the chamber controllers to a central control module, whereby the modular vacuum system is reconfigurable with the same or different type of chamber module.

3. The modular vacuum system of claim 2, wherein the central transfer chamber module is connected to three or more of the chamber modules, and the platform supports three or more of the interface panels.

4. The modular vacuum system of claim 2, further comprising:
   a modular control system comprising:
      a first object representative of the central transfer chamber module; and
      one or more chamber module objects representative of each chamber module.

5. The modular vacuum system of claim 4, wherein:
   the first object provides signals adapted to actuate the operation of the central transfer chamber module and coordinates overall performance of the system; and
   the one or more chamber module objects provide signals adapted to operate each chamber module and to coordinate with the central transfer chamber module in overall performance of the system.

6. The modular vacuum system of claim 5, wherein:
   each chamber module comprises chamber-specific devices adapted to perform chamber specific tasks; and
   each chamber module object comprises:
      one or more input/output (I/O) devices adapted to provide electrical signals to the chamber-specific devices to perform the specific tasks;
      one or more driver modules adapted to send I/O-device-specific commands causing the I/O devices to send the electrical signals;
      one or more controller modules adapted to send driver-module-specific commands causing the driver modules to send the I/O device specific commands; and
      one or more manager modules adapted to send controller-module-specific commands causing the various controller modules to send the driver module specific commands.

7. The modular vacuum system of claim 6, wherein:
   the manager modules control high-level functions for the respective chamber module;

the controller modules provide mid-level commands adapted to carry out the high-level functions; and the driver modules provide low-level commands adapted to carry out the mid-level commands.

8. The modular vacuum system of claim 6, wherein:

the central control module sends control and data parameters to the first object and the one or more chamber module objects.

9. The modular vacuum system of claim 8, wherein the chamber control module configures the first object and the one or more chamber module objects and initiates them as processes running within the modular control system.

10. The modular vacuum system of claim 9, wherein:

the one or more chamber controllers are electrically connected to the one or more chamber modules, wherein each chamber controller sends command signals adapted to actuate operation of each chamber module and receives sensory signals adapted to indicate performance and status of each chamber module.

11. The modular vacuum system of claim 10, wherein:

the chamber control module determines a chamber module object for each chamber module controller and initiates the chamber module object as a process running on the chamber module controller;

whereby:

each chamber module object performs routines adapted to cause the chamber module controller to send command signals to actuate operation of the chamber module.

12. The modular vacuum system of claim 1, further comprising:

a load lock structure including two load lock chambers connected to the central transfer chamber module; and a mini-environment connected to both load lock chambers.

13. The modular vacuum system of claim 1, wherein each delivery line has a plurality of interface panel connections adapted to couple the delivery line to each interface panel.

14. The modular vacuum system of claim 13, wherein each delivery line has a connector adapted to couple all the delivery lines to the facilities panel box.

15. The modular vacuum system of claim 1, further comprising at least one return line have a plurality of interface panel connections adapted to couple the return line to each interface panel.

16. The modular vacuum system of claim 1, wherein the interface panel further comprising an electrical connection box.

17. The modular vacuum system of claim 1, wherein the interface panel further comprises a subpanel adapted to provide additional configuration capability.

18. A modular vacuum system for processing substrates, comprising:

a platform supporting one or more interface panels;

a facilities panel box disposed on the platform and adapted to be coupled to facility lines;

at least one delivery line, each delivery line supported on the platform and adapted to be coupled to the facilities panel box and to each interface panel;

a central transfer chamber supported on the platform and having a robot disposed therein;

one or more chamber modules connected to the central transfer chamber, each chamber module is connected to one interface panel; and each chamber module supported on a chamber module platform and having a chamber controller and an interface connecting each of the chamber controllers to a central control module.

* * * * *

UNITED STATES PATENT AND TRADEMARK OFFICE
CERTIFICATE OF CORRECTION

PATENT NO. : 6,312,525 B1
DATED : November 6, 2001
INVENTOR(S) : Bright et al.

It is certified that error appears in the above-identified patent and that said Letters Patent is hereby corrected as shown below:

Column 3,
Line 5, please replace "costs" with -- cost --.

Column 4,
Line 44, please delete "detailed".

Column 5,
Line 63, please delete "from the".

Column 6,
Line 28, after "panel", please insert -- box --.

Column 8,
Line 64, after "each", please delete "chamber".
Line 66, after "chamber" please insert -- power --.

Column 10,
Line 55, after "of the", please delete "if".

Column 11,
Line 24, please delete "10".
Line 35, please replace "68030$^{TM}$ based" with -- 68030$^{TM}$-based --.

Column 15,
Line 52, after "system", please delete "10".

UNITED STATES PATENT AND TRADEMARK OFFICE
CERTIFICATE OF CORRECTION

PATENT NO. : 6,312,525 B1
DATED : November 6, 2001
INVENTOR(S) : Bright et al.

It is certified that error appears in the above-identified patent and that said Letters Patent is hereby corrected as shown below:

Column 16,
Line 6, please replace "comprising;" with -- comprising: --

Column 18,
Line 8, please replace "have" with -- having --.

Signed and Sealed this

Thirtieth Day of July, 2002

Attest:

Attesting Officer

JAMES E. ROGAN
Director of the United States Patent and Trademark Office